(12) United States Patent
Opris

(10) Patent No.: US 6,222,422 B1
(45) Date of Patent: Apr. 24, 2001

(54) METHOD AND APPARATUS FOR GENERATING A SYMMETRICAL OUTPUT SIGNAL FROM A NON-SYMMETRICAL INPUT

(75) Inventor: Ion E. Opris, Cupertino, CA (US)

(73) Assignee: NanoPower Technologies, Inc., Costa Mesa, CA (US)

( * ) Notice: Subject to any disclaimer, the term of this patent is extended or adjusted under 35 U.S.C. 154(b) by 0 days.

(21) Appl. No.: 09/385,916

(22) Filed: Aug. 30, 1999

(51) Int. Cl.[7] ............................. H03L 7/099; H03L 1/00; H03B 1/00; H03K 3/017; H03K 5/01
(52) U.S. Cl. ..................... 331/25; 331/1 A; 331/74; 331/175; 327/166; 327/171; 327/159; 327/294
(58) Field of Search ................................. 331/1 A, 18, 25, 331/74, 175; 327/100, 166, 171, 293, 294, 298, 156–159

(56) References Cited

U.S. PATENT DOCUMENTS 5,155,452 * 10/1992 Ueda et al. ........................ 331/111
5,491,441 * 2/1996 Goetschel et al. ................. 327/291

* cited by examiner

*Primary Examiner*—David Mis
(74) *Attorney, Agent, or Firm*—Blakely, Sokoloff, Taylor & Zafman LLP

(57) ABSTRACT

A method of generating a symmetrical output signal with a 50% duty cycle. The symmetrical output signal is generated without the need for the input signal to be at twice the frequency of the output signal. By utilizing the differential output of a circuit and cross-coupling this to the inputs of comparators a series of outputs are obtained. These outputs are then used to control a latch device by utilizing only a single edge. Because only a single edge is used to control the low to high and high to low transition, the delay is a fixed constant and the resulting output is a symmetrical output signal with a 50% duty cycle.

24 Claims, 7 Drawing Sheets

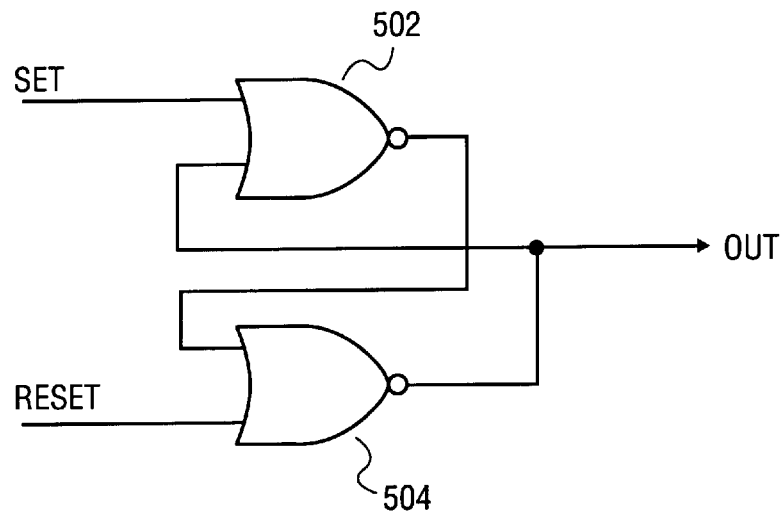
FIG. 5
| STATE | SET | RESET | OUT |
|---|---|---|---|
| A | 0 | 0 | NO CHANGE |
| B | 0 | 1 | 0 |
| C | 1 | 0 | 1 |
| D | 1 | 1 | 0 |
FIG. 6
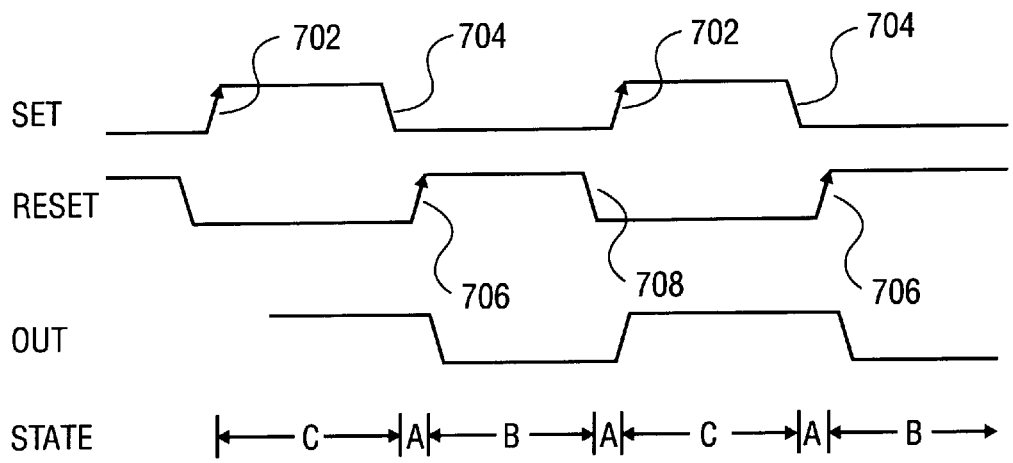
FIG. 7

METHOD AND APPARATUS FOR GENERATING A SYMMETRICAL OUTPUT SIGNAL FROM A NON-SYMMETRICAL INPUT

FIELD OF THE INVENTION

The present invention pertains to the field of electronic signal generation. More particularly, the present invention relates to the ability to generate a clock signal with a 50% duty cycle.

BACKGROUND OF THE INVENTION

In many applications a need exists for clock signals with a symmetrical output, i.e., 50% duty cycle. In particular, it is advantageous in an electronic system to have an output that has a 50% duty cycle. The symmetrical output allows many circuits to operate at peak efficiency and avoid the issue of non-symmetrical and possibly overlapping signals.

In the field of Liquid Crystal Displays (LCDs), for example, a symmetrical signal driving the display is desired because any deviation from a 50% duty cycle results in a DC bias. This DC bias may be detrimental to the long term stability of the LCD. Thus, a driver having a 50% duty cycle can be quite beneficial.

In Voltage Controlled Oscillators (VCOs), it may be desirable to have a symmetrical output to drive circuitry, while at the same time running the VCO at the lowest possible frequency while obtaining a symmetrical output. In a Phase Lock Loop (PLL) a symmetrical output signal is desired in order to more effectively track and correct frequency and/or phase changes. One current approach to achieve the symmetrical output is centered around comparison of differential signals.

For example, in an Integrated Circuit (IC) application, a VCO may be implemented in a fully differential fashion to improve power supply rejection and noise immunity, and the VCO output signal is a distorted differential wave. A circuit may then be used to convert this signal into a square wave. One such approach is illustrated in FIG. 1, where the output signals 104 & 106 from a VCO 100 are coupled to the inputs of a comparator 102 and the output is a square wave. It is very difficult to cause the output to have a 50% duty cycle, because of the difference in the propagation delays from the comparator inputs to output. FIG. 2 shows an example of a comparator. A signal presented on input Inp 220 travels through transistor M1 and transistor M5 before reaching the output. On the other hand, a signal presented on input Inn 222 travels through transistor M2, transistor M3, and transistor M5 before reaching the output. Because of the differences in the paths through the comparator for each input, the input to output delay is different for each input signal. At high frequency, this delay difference may become significant. As a result of the delay difference, the generation of a symmetrical output signal may become very difficult.

Another approach to achieve a symmetrical output is to route a signal to a divide-by-two circuit. Such a circuit produces a symmetrical output. A disadvantage of this approach is that it may not be practical to run a circuit at twice the desired output frequency. Additionally, running a circuit at twice the desired output frequency tends to draw more power, thereby lowering efficiency, generating more heat, and thus lowering the life of components and circuitry.

Therefore, it is desirable to provide a symmetrical output signal with a 50% duty cycle without the need to run the input signal at twice the desired output frequency.

SUMMARY OF THE INVENTION

The present invention describes a method and apparatus for generating a symmetrical output signal from a non-symmetrical input signal. A non-symmetrical input signal is presented to the inputs of two or more comparators. A complement of the input signal is presented to the opposite inputs of the same comparators. The comparators generate output signals that are routed to a device, which by using common edges of the comparators output signals, generates a symmetrical output signal.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 5 is a circuit diagram of an embodiment of the R-S latch utilizing NOR gates.

FIG. 6 is a truth table diagram for the circuit depicted in FIG. 5.

FIG. 7 is a waveform diagram illustrating the operation of the circuit depicted in FIG. 5.

DETAILED DESCRIPTION

A method and apparatus for accurately generating a symmetrical output signal from an input of the same frequency are described. The invention, by utilizing the same edge of an input signal to control when the output signal transitions from low to high, and high to low, is capable of generating a symmetrical output signal. Because of the use of a single input edge to control both output transitions (low to high, and high to low), the input edge experiences the same fixed delay in controlling when the output transitions occur. This is in contrast to a conventional approach, such as that shown in FIG. 1, which utilizes both edges of an input signal to control the output transitions. Because of the difference in delays of the input signals for both edges in the conventional circuit, a variation exists in the output signal which prevents the generation of a 50% duty cycle. The use of a single edge, with the resulting single constant delay, which controls both transitions, allows the method and apparatus described herein to generate a symmetrical output signal.

Figure 1:
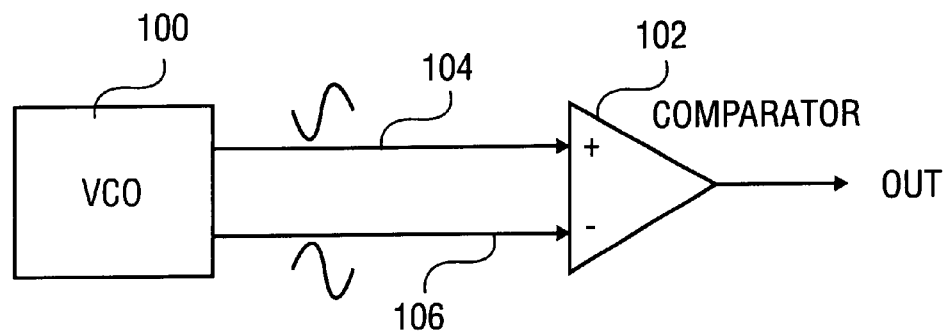
FIG. 1 is a block diagram of a VCO and a circuit for generating an output square wave.
Figure 2:
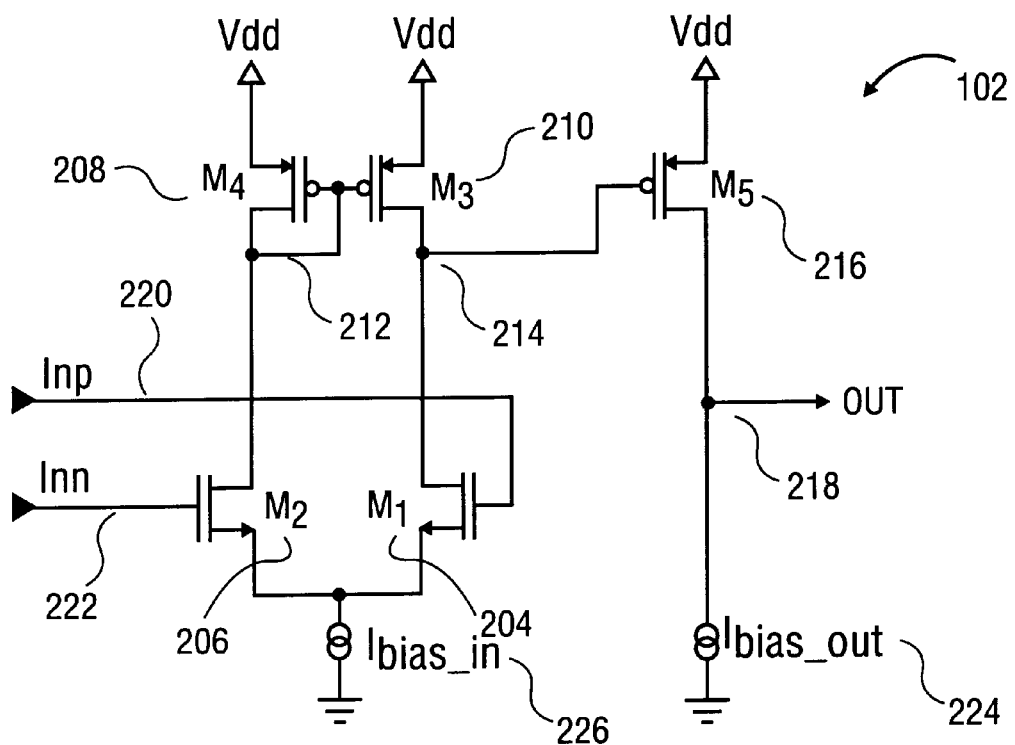
FIG. 2 is a circuit diagram of an implementation of a comparator.

FIG. 1 depicts a block diagram of a VCO 100 and a conventional circuit for generating an output square wave, such as a comparator 102. The comparator 102, in one possible implementation, is detailed in FIG. 2. FIG. 2 has two input transistors M1 204 and M2 206. The gate 220 of M1 204 receives the input Inp. The gate 222 of M2 206 receives the input Inn. The source of M1 204 and the source of M2 206 are connected together and to a constant current source Ibias__in 226, whose other connection is to the power supply ground. The drain of M2 206 is connected to the drain and gate 212 of M4 208. The source of M4 208 is connected to the power supply connection Vdd. The drain 214 of M1 204 is connected to the drain of M3 210. The source of M3 210 is connected to the power supply connection Vdd. The gate 212 of M3 210 is connected to the gate 212 of M4 208. The drain 214 of M1 204 is connected to the gate 214 of transistor M5 216. Transistor M5 216 has its source connected to the power supply connection Vdd. The drain 218 of M5 216 is connected to Out 218 and to a constant current source Ibias__out 224, whose other connection is to the power supply ground.

The input to output delay varies depending upon the input used. A signal presented on input Inp 220 affects transistor M1 204 causing node 214 to change. Node 214 is connected directly to the gate of transistor M5 216. When node 214 changes, this change affects M5 216, which in turn directly generates output signal Out 218. The delay through this path is M1 and M5. On the other hand, a signal presented on input Inn 222, affects transistor M2 206 causing node 212 to change. Node 212 is connected directly to the gate of transistor M3 210. When node 212 changes, this change affects M3 210, which generates a signal on node 214. Node 214 is connected directly to the gate of transistor M5 216. When node 214 changes, this change affects M5 216, which in turn directly generates output signal Out 218. The delay through this path is M2, M3, and M5. Because the paths through the comparator are different for each input, the input to output delay is different for each input. Because of this variation in delay from the inputs to the output, the input signals from the VCO are delayed differing amounts. These differences in delay result in variation of the comparator output signal. At high frequency, this delay difference becomes significant, and as a result of this variation, the generation of a symmetrical output signal becomes very difficult.

Figure 3:
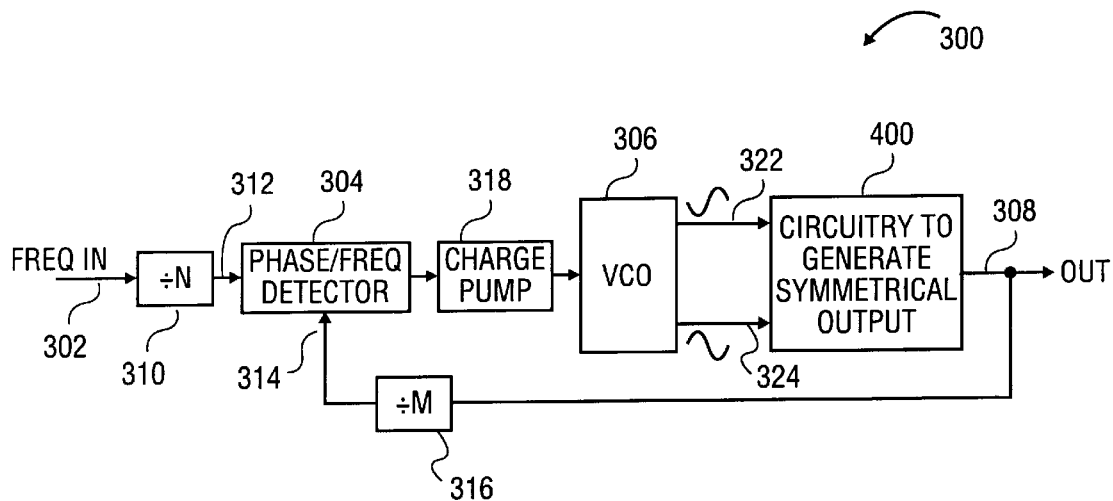
FIG. 3 is a diagram of an embodiment of a circuit for generating a symmetrical output clock signal used in a frequency synthesizer application.

FIG. 3 depicts a block diagram of a frequency synthesizer 300 which includes a circuit 400 for generating a symmetrical output clock signal. The frequency synthesizer 300 is also called a clock generator, a clock generation circuit, a PLL/Synthesizer, a clock synthesizer, etc. The clock generator 300 receives an input frequency, Freq In 302, from a source, such as a crystal oscillator. This input 302 is coupled to a divide-by-N (÷N) circuit 310 whose output is coupled to a first input 312 of a phase and/or frequency detector 304, which controls a charge pump 318. The charge pump 318 output voltage is used to control a Voltage Controlled Oscillator (VCO) 306. The VCO 306 differential output signals 322 and 324 are routed to a circuit for generating a symmetrical output clock signal 400. The output, Out 308, from the circuit for generating a symmetrical output clock signal 400 is then coupled to a system for use, and coupled to a divide-by-M (÷M) circuit 316, whose output is coupled to a second input 314 of the phase and/or frequency detector 304.

Figure 4:
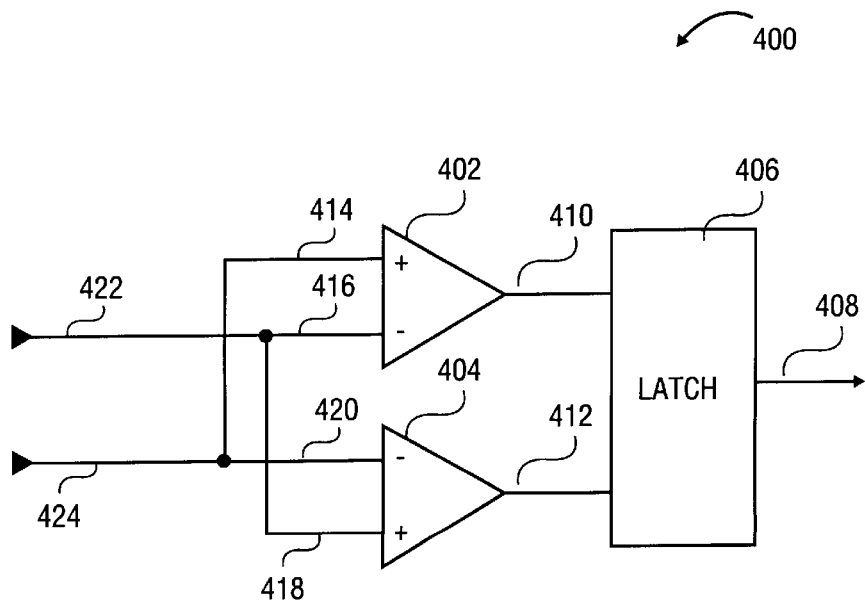
FIG. 4 is a schematic diagram of an embodiment of a circuit for generating a symmetrical output clock signal.

FIG. 4 illustrates in greater detail the circuit 400 that may be used to generate a symmetrical clock signal, according to one embodiment. The circuit 400 includes comparators 402 and 404, used for comparing the input signals 422 and 424. The input signals 422 and 424 my be differential signals from any circuit whose output is desired to make symmetrical, such as signals 322 and 324 in FIG. 3. The inputs 422 and 424 are routed to the cross coupled inputs of a pair of comparators 402 and 404. Comparator 402 receives the input signal 424 on its positive input 414, and input signal 422 on its negative input 416. Comparator 404 receives the input signal 424 on its negative input 420, and input signal 422 on its positive input 418. The outputs 410 and 412, from the comparators 402 and 404 respectively, are then presented as inputs to circuit 406, a latch device, which then produces the symmetrical output 408. Because the input signals 422 and 424 are routed to different inputs on the comparators 402 and 404, the latch 406 in this embodiment is controlled by a common edge. Thus, the delay through each comparator 402 and 404 is fixed. The only variation of the output signal 408 is the difference in the delay in the latch 406. This variation is small and can be further reduced by proper latch design.

FIG. 5 illustrates an implementation of latch device 406, a R-S latch circuit, utilizing NOR gates 502 and 504. NOR gate 504 has as one input the Reset signal and as the other the output signal from NOR gate 502. NOR gate 502 has as one input the Set signal and as the other the output from NOR gate 504. The output of NOR 504 drives the output signal Out. Where the outputs from the comparators, such as 410 and 412, have a duty cycle of less than 50%, this NOR based R-S latch is a desirable implementation because the R-S NOR latch will go into known states of operation. That is, the Set to Reset operation, and Reset to Set operation are consistent and well defined. FIG. 6 illustrates the truth table for the R-S NOR latch. States A, B, C, and D have been denoted to assist in the circuit explanation. In State A, the Set input is a logic 0, the Reset input is a logic 0, and the Out signal does not change, that is it remains as it previously determined level of 1 or 0. In State B, the Set input is a 0, the Reset input is a 1, and the Out signal is a 0. In State C, the Set input is a 1, the Reset input is a 0, and the Out signal is a 1. In State D, the Set input is a 1, the Reset input is a 1, and the Out signal is a 0.

FIG. 7 illustrates waveforms resulting from the R-S NOR latch of FIG. 5 in operation. Set and Reset are input signals and Out is the output of the R-S NOR latch. Upon the rising edge of the Set signal 702 while the Reset is low (at 0), State C is entered and Out goes high (to a 1). Upon the Set signal falling low 704 while the Reset is at 0, State A is entered and there is no change in Out. When the Reset signal transitions high 706 while the Set signal is 0, State B is entered and Out goes low (to a 0). Upon the Reset signal going low 708 while Set is low, State A is entered and there is no change in Out. The sequence then repeats itself with Set going high. Thus, we see that Out is a square wave output signal that makes transitions in response to only a single edge of the Set and Reset (in this example the positive rising edges of Set and Reset). One skilled in the art will understand that if Set and Reset have a duty cycle of greater than 50% that the R-S NOR latch will not yield the desired output because the transitions will not include State A and thus the output will be controlled by both the R-S edges as well as the R-S combinatorial inputs.

Figure 8:
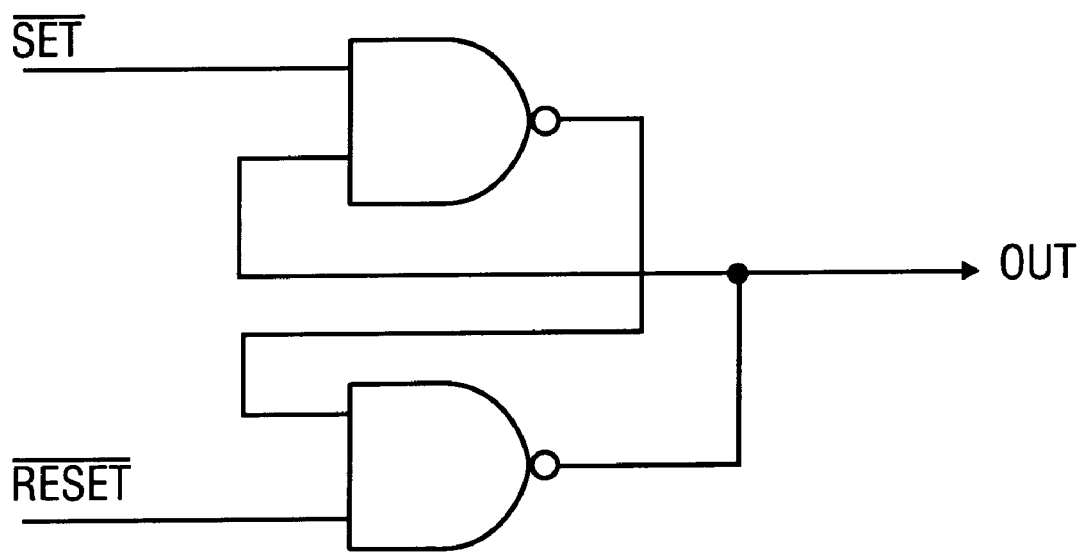
FIG. 8 is a circuit diagram of another embodiment of the R-S latch utilizing NAND gates.

FIG. 8 illustrates an implementation of latch device 406, a R-S latch circuit, utilizing NAND gates. Where the outputs from the comparators (such as 410 and 412) have a duty cycle of greater than 50%, this NAND based R-S latch is a desirable implementation, because the R-S latch will go into known states of operation. That is, the Set to Reset operation, and Reset to Set operation are consistent and well defined. An analysis of the R-S NAND latch, similar to the analysis of the R-S NOR latch done above, performed by one skilled in the art, will verify the proper operation of the R-S NAND latch with input signals having a greater than 50% duty cycle.

Figure 9:
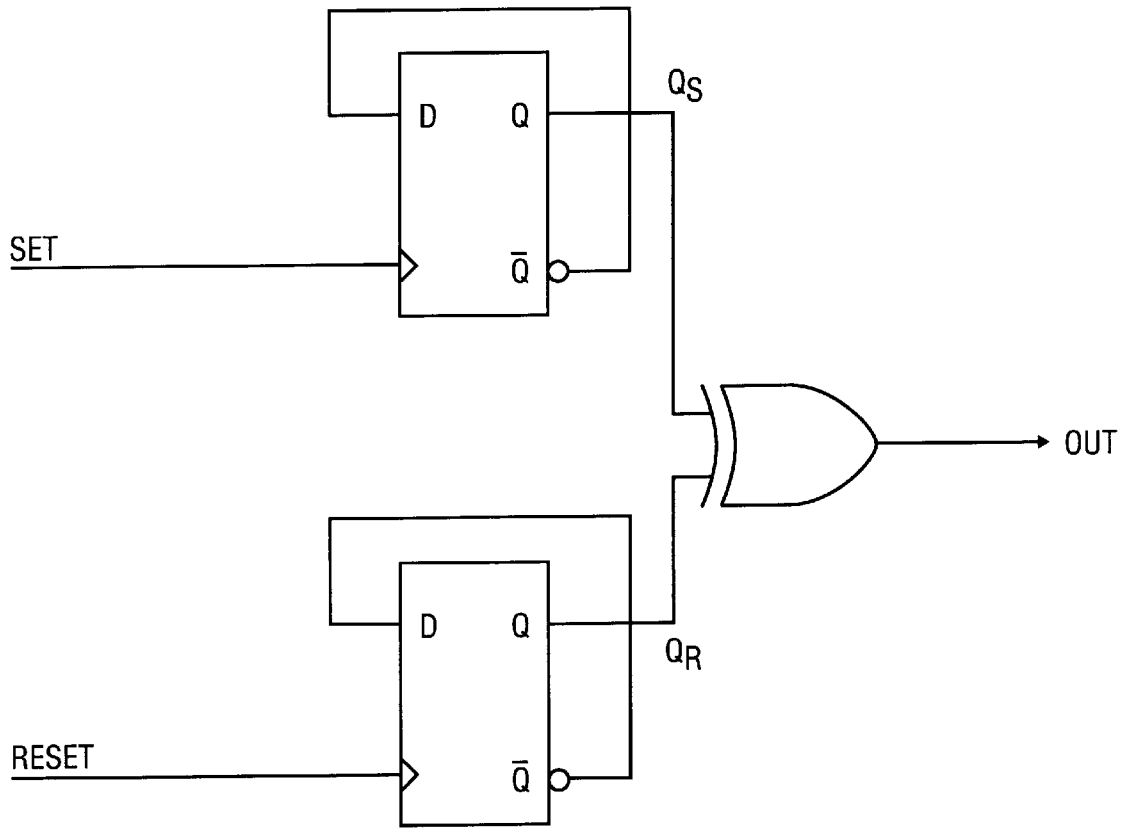
FIG. 9 is a circuit diagram of another embodiment of the R-S latch utilizing flip-flops.

FIG. 9 illustrates an implementation of latch device 406, a R-S latch circuit, utilizing flip-flops. Where the outputs from the comparators (such as 410 and 412) have an unknown duty cycle, this flip-flop based R-S latch is a desirable implementation, because the R-S latch will not go into an unknown state of operation. That is, the Set to Reset operation, and Reset to Set operation are consistent and well defined. FIG. 9 illustrates the Set and Reset signals being used to toggle the outputs of their respective flip-flops. These outputs are then Exclusive-OR'd (XOR) together to produce the Out. The XOR operation only changes the Out based on a change of the flip-flop outputs, which are triggered by a single edge of the Set and Reset signal. Because of the configuration of the flip-flops, the flip-flop outputs are symmetrical regardless of whether the input signals are less than, equal to, or greater than 50% duty cycle. The symmetrical flip-flop outputs are inputs to the XOR that yields a symmetrical Out signal.

Figure 10:
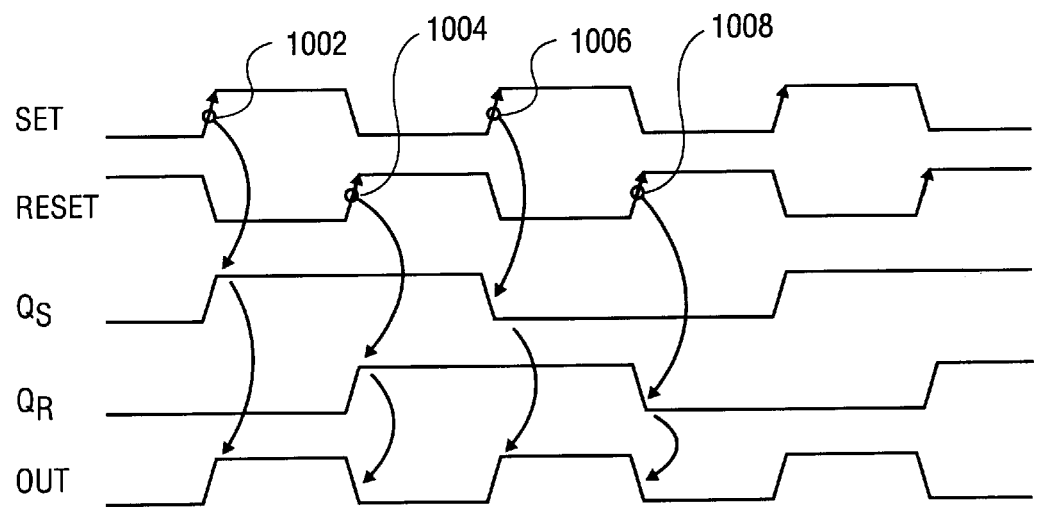
FIG. 10 is waveform diagram illustrating the operation of the circuit depicted in FIG. 9, when the Set and Reset inputs have a 50% duty cycle.
Figure 11:
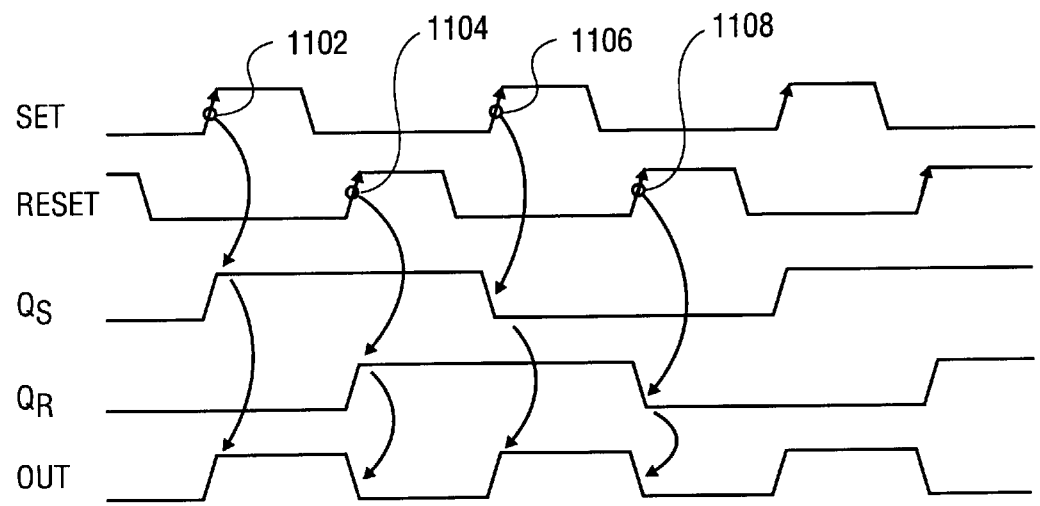
FIG. 11 is waveform diagram illustrating the operation of the circuit depicted in FIG. 9, when the Set and Reset inputs have a less than 50% duty cycle.
Figure 12:
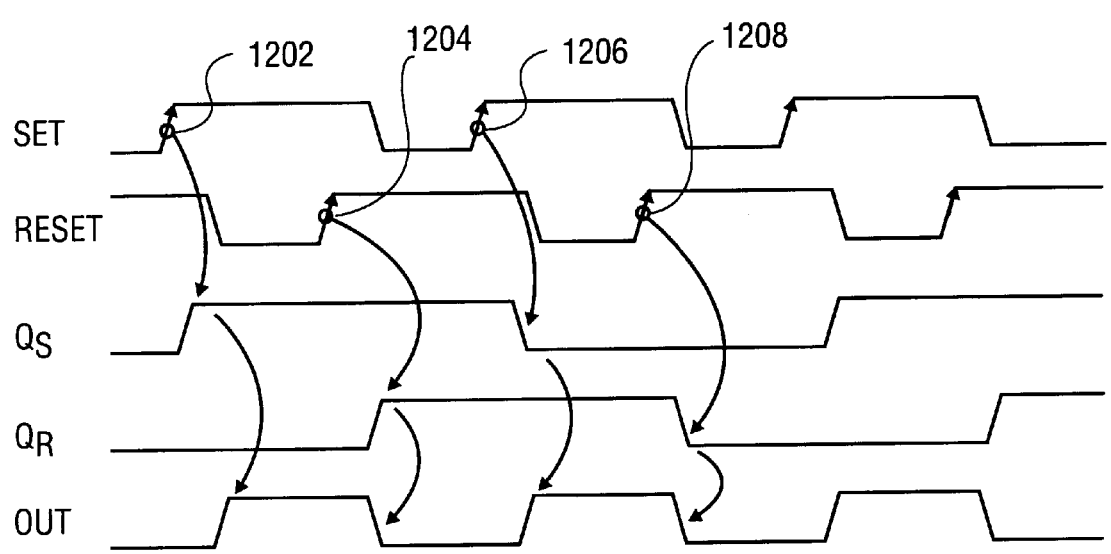
FIG. 12 is waveform diagram illustrating the operation of the circuit depicted in FIG. 9, when the Set and Reset inputs have a greater than 50% duty cycle.

FIG. 10 shows in detail the operation of the circuit of FIG. 9 when the Set and Reset signals have a duty cycle of 50%. The rising edge of Set signal 1002, causes $Q_S$ to go high, causing Out to go high. The rising edge of Reset signal 1004, causes $Q_R$ to go high, causing Out to go low. The next rising edge of Set signal 1006, causes $Q_S$ to go low, causing Out to go high. The next rising edge of Reset signal 1008, causes $Q_R$ to go low, causing Out to go low. The sequence then repeats 1002, 1004, 1006, 1008, etc., producing a symmetrical signal Out. Similarly, FIG. 11 shows in detail the operation of the circuit of FIG. 9 when the Set and Reset signals have a duty cycle of less than 50%, and FIG. 12 shows in detail the operation of the circuit of FIG. 9 when the Set and Reset signals have a duty cycle of greater than 50%, all producing a symmetrical signal Out.

Thus, a method and apparatus for accurately generating a symmetrical output signal have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for obtaining a symmetrical output signal, comprising:
   performing a first comparison of a differential input signal at a first polarity to generate a first output;
   performing a second comparison, concurrently with the first comparison, of the differential input signal at a polarity opposite to the first polarity to generate a second output; and
   using a common edge of the first and second outputs to control a fixed delay device generating the symmetrical output signal.

2. A method according to claim 1, wherein the fixed delay device is a latch.

3. A method according to claim 2, wherein the latch is a Reset-Set (R-S) latch.

4. A method according to claim 3, wherein the R-S latch comprises a plurality of NOR gates.

5. A method according to claim 3, wherein the R-S latch comprises a plurality of NAND gates.

6. A method according to claim 3, wherein the R-S latch comprises a plurality of flip-flops.

7. A method according to claim 6, wherein the flip-flops are D type flip-flops.

8. A method according to claim 7, wherein the R-S latch further comprises an exclusive-OR (XOR) gate, wherein the D type flip-flops generate outputs that are coupled to the XOR gate, wherein the XOR gate generates the symmetrical output signal.

9. A symmetric output signal generating device comprising:
   means for comparing an input signal to generate a first output;
   means for comparing a complement of the input signal to generate a second output; and
   means for latching the first and second output signals, such that an output of the latching means is a symmetrical output signal.

10. A Phase Lock Loop (PLL) circuit comprising:
    a phase/frequency detector (PFD), having a plurality of inputs and an output, a first input being coupled to a frequency source;
    a Voltage Controlled Oscillator (VCO), having an input and a differential output, the output from the PFD being coupled to the VCO input;
    a circuit for generating a symmetric output signal by cross-coupling the VCO output differential signal to the inputs of a plurality of comparators, the comparators generating a series of outputs, the comparator outputs being used to control a latch device by utilizing only a single common edge to produce an output signal with a 50% duty cycle; and
    a second PFD input being coupled to the output signal with a 50% duty cycle.

11. The system in claim 10, wherein the circuit for generating a symmetric output signal operates at a frequency no higher than the VCO differential output frequency.

12. An apparatus comprising:
    a plurality of comparators, each comparator having a positive and a negative input and an output;
    a Voltage Controlled Oscillator (VCO) generating differential output signals, the VCO differential output signals being coupled to the inputs of the plurality of comparators, such that each VCO differential output signal is connected to the positive input of one of the plurality of comparators and the negative input of the other of the plurality of comparators;
    a plurality of D type flip-flops, each having a clock and data input, and an output, each comparator output being coupled to the clock inputs of a respective D type flip-flop, and the D type flip-flops being configured for a divide operation; and
    an exclusive-OR (XOR) device, having inputs and an output, the outputs of the D type flip-flops each being coupled to the input of the XOR device, such that the output of the XOR device is a symmetrical signal.

13. An apparatus comprising:
    means for generating a differential signal;
    means for coupling the differential signal to a set of cross-coupled comparator inputs;
    means for coupling a comparator output to a means of dividing the signal; and means for coupling the output from the divide means to a means for transitioning on a edge thereby producing a symmetrical output signal.

14. A clock generation system providing a symmetrical output signal comprising:
    a resonator providing a frequency input source; and
    a clock generator coupled to the resonator, the clock generator having:
        a divide-by-N circuit having an input and an output, the frequency source input being coupled to the divide-by-N circuit input;
        a phase/frequency detector with a first and a second input and an output, the first input of the phase/frequency detector being coupled to the output of the divide-by-N circuit;
        a charge pump with an input and an output, the charge pump input being coupled to the phase/frequency output;
        a Voltage Controlled Oscillator (VCO), having an input and a differential output, the input of the VCO being coupled to the output of the charge pump;
        a circuit for generating the symmetrical output signal having an input and an output, the circuit for generating the symmetrical output signal operating by cross-coupling the VCO differential output signal to the inputs of a plurality of comparators, the comparators generating a series of outputs, the comparator outputs then being used to control a latch device by utilizing only a single common edge, thereby resulting in an output signal with a 50% duty cycle; and
        a divide-by-M circuit having an input and an output, the input of the divide-by-M circuit being coupled to the output of the circuit for generating the symmetrical output signal, and the output of the divide-by-M circuit being coupled to the second input of the phase/frequency detector.

15. The clock generation system as recited in claim 14, further comprising:
    an Integrated Circuit (IC) chip wherein, the divide-by-N circuit, the phase/frequency detector, the charge pump, the VCO, the divide-by-M circuit, and the circuit for generating the symmetrical output signal are on the IC chip.

16. An apparatus for generating a symmetrical output signal from a non-symmetrical input signal, the apparatus comprising:
    a plurality of comparators each with a first input, a second input, and an output, the first and second inputs of the plurality of comparators being cross-coupled to form a first set of cross-coupled inputs and a second set of cross-coupled inputs, the first set of cross-coupled inputs coupled to the non-symmetrical input signal and the second set of cross-coupled inputs coupled to a complement of the non-symmetrical input signal, wherein the plurality of comparators produce a plurality of comparator output signals;
    a delay device with a plurality of inputs and an output; and
    the plurality of inputs on the delay device are coupled to the plurality of comparator output signals, such that the delay device generates the symmetrical output signal.

17. Apparatus according to claim 16, wherein the non-symmetrical input signal is from a Voltage Controlled Oscillator (VCO).

18. Apparatus according to claim 16, wherein the non-symmetrical input signal is from a Phase Lock Loop (PLL).

19. Apparatus according to claim 16, wherein the non-symmetrical input signal is from a frequency synthesizer.

20. Apparatus according to claim 16, wherein the non-symmetrical input signal is from a clock generation circuit.

21. Apparatus according to claim 16, wherein the device generating the symmetrical output signal comprises a plurality of NOR logic gates.

22. Apparatus according to claim 16, wherein the device generating the symmetrical output signal comprises a plurality of NAND logic gates.

23. Apparatus according to claim 16, wherein the device generating the symmetrical output signal comprises a plurality of flip-flops.

24. Apparatus according to claim 23, wherein the device generating the symmetrical output signal further comprises an exclusive-OR (XOR) logic gate.

* * * * *